United States Patent
Lee et al.

(10) Patent No.: US 7,395,851 B2
(45) Date of Patent: Jul. 8, 2008

(54) HEAT DISSIPATION DEVICE

(75) Inventors: Hsieh-Kun Lee, Tu-Cheng (TW); Wan-Lin Xia, Shenzhen (CN); Tao Li, Shenzhen (CN); Min-Qi Xiao, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 131 days.

(21) Appl. No.: 11/344,317

(22) Filed: Jan. 30, 2006

(65) Prior Publication Data

US 2007/0029072 A1 Feb. 8, 2007

(30) Foreign Application Priority Data

Aug. 8, 2005 (CN) ..................... 2005 1 0036492

(51) Int. Cl.
*F28D 15/02* (2006.01)

(52) U.S. Cl. .................. 165/80.3; 165/104.33
(58) Field of Classification Search ............. 165/80.2, 165/80.3, 104.21, 104.26, 104.33; 361/700; 257/715

See application file for complete search history.

(56) References Cited

U.S. PATENT DOCUMENTS

| | | | | |
|---|---|---|---|---|
| 6,189,601 B1 * | 2/2001 | Goodman et al. | ......... | 165/80.3 |
| 6,651,734 B1 * | 11/2003 | Liu | ............ | 165/80.3 |
| 6,779,595 B1 * | 8/2004 | Chiang | ............ | 165/104.33 |
| 6,945,319 B1 * | 9/2005 | Li et al. | ............ | 165/104.33 |
| 6,978,829 B1 * | 12/2005 | Lin | ............ | 165/104.33 |
| 7,000,687 B2 * | 2/2006 | Ying et al. | ............ | 165/104.33 |
| 2004/0190261 A1 * | 9/2004 | Lopatinsky et al. | ......... | 361/704 |
| 2006/0175045 A1 * | 8/2006 | Chen | ............ | 165/104.33 |

FOREIGN PATENT DOCUMENTS

| | | |
|---|---|---|
| CN | 2605665 Y | 3/2004 |
| CN | 2650209 Y | 10/2004 |
| TW | 326939 | 2/1998 |
| TW | 514488 | 12/2002 |
| TW | TM-526960 | 4/2003 |
| TW | 532747 | 5/2003 |
| TW | 592340 | 6/2004 |
| TW | M247921 | 10/2004 |
| TW | TM-M249104 | 11/2004 |
| TW | M261012 | 4/2005 |

* cited by examiner

*Primary Examiner*—Teresa J. Walberg
(74) *Attorney, Agent, or Firm*—Morris Manning Martin LLP; Tim Tingkang Xia, Esq.

(57) ABSTRACT

A heat dissipation device comprises a heat spreader for contacting an electronic device for absorbing heat therefrom. A plurality of fins is formed on the heat spreader. A first heat sink is separated from the heat spreader and comprises a first base substantially perpendicular to the heat spreader and a plurality of first fins formed on the first base. A second heat sink comprises a second base connecting with the first base and a plurality of second fins formed on the second base. Two heat pipes connect the heat spreader with the first base and the second base via opposite sides of the heat dissipation device. The heat pipes are partly sandwiched between the first base and the second base and transfers heat from the heat spreader to both of the first and the second heat sink.

20 Claims, 3 Drawing Sheets

US 7,395,851 B2

HEAT DISSIPATION DEVICE

CROSS-REFERENCE TO RELATED APPLICATIONS

This application is a co-pending application of U.S. patent application Ser. No. 11/135,628, entitled "heat dissipating device", which was filed on May 23, 2005 and the entire contents of which are incorporated herein by reference.

BACKGROUND

1. Field of the Invention

The present invention generally relates to a heat dissipation device for removing heat from a heat-generating device, and more particularly to a heat dissipation device with heat pipes for cooling an electronic device such as a Central Processing Unit (CPU).

2. Description of Related Art

Electronic devices such as central processing units (CPUs) generate lots of heat during normal operation. Unless removed, such heat will adversely affect the operational stability of the CPUs. Solutions must be taken to efficiently remove the heat. Typically, a heat sink is mounted on a CPU to remove heat therefrom.

Conventional heat sinks such as aluminum extrusion type heat sinks are widely used for heat dissipation of electronic devices. However, the aluminum extrusion type heat sinks which each commonly include a flat base and a plurality of fins extending integratedly from the base, have many disadvantages. The first is that the total surface area of the fins available for heat dissipation is very limited as the distance between adjacent fins cannot be desirably small enough. This seriously bars improvement of the heat removal rate of the aluminum extrusion type heat sinks. Another disadvantage is that the heat generated by heat sources cannot be rapidly transferred to remote portions of the fins so that the remote portions have a relatively lower heat dissipation effect. This also limits heat dissipation efficiency of the heat sinks.

To solve the above disadvantages of aluminum extrusion type heat sinks, a heat sink having an inverted-T-shaped base and a plurality of fins, has been developed. Taiwan Patent Issue No. 326939 shows an example of this kind of heat sink. The performance of this kind of heat sink is greater than aforesaid aluminum extrusion type heat sinks. However, heat is transferred to the fins still by a conventional conduction which is inherently slow and not enough to remove the heat promptly from the heat source to meet the requirement of heat dissipation of high-powered heat-generating electronic devices.

To enhance the performance of a heat sink, nowadays, heat pipes have been widely used. A heat pipe is a pipe with a hermetically sealed chamber, in which a wicking structure is formed and working fluid is filled. The heat pipes work as follows. Thermal energy enters an evaporating section of the heat pipe and vaporizes the working fluid. The working fluid moves in the heat pipe to an area of lower temperature, and then condenses. After the vapor condenses, the wicking structure draws the liquid back to the evaporating section by capillary action of the wick structure. The cycle is repeated continuously and heat is transferred from high temperature area to low temperature area. Because of the rapid transport capability of the vapor, the heat pipe has a very highly effective thermal conductivity over a long distance. In order to improve performance of a heat sink, today heat pipes are widely used in combination with the heat sink. The combination manner between the heat pipes and the heat sink significantly affects heat dissipation effectiveness of a heat dissipation device consisting of the heat sink and the heat pipes.

Therefore, it is desired to design a novel heat dissipation device with heat pipes wherein the heat pipes are combined with a heat sink in such a way that the heat dissipation device can have an optimal heat dissipation effect.

SUMMARY

Accordingly, what is needed is a heat dissipation device which has a satisfactory heat dissipation efficiency for removing heat from a heat-generating electronic device.

A heat dissipation device for removing heat from a heat-generating electronic device in accordance with a preferred embodiment of the present invention comprises a heat spreader provided with a plurality of upwardly extending fins. A first heat sink is separated from the heat spreader and comprises a first base substantially perpendicular to the heat spreader and a plurality of laterally extending first fins formed on the first base. A second heat sink comprises a second base connecting with the first base and a plurality of second laterally extending fins formed on the second base. Two heat pipes thermally connect the heat spreader with the first base and the second base via opposite sides of the heat dissipation device. The heat pipes are partly sandwiched between the first base and the second base and transfers heat from the heat spreader to both of the first and the second heat sink.

Other advantages and novel features of the present invention will become more apparent from the following detailed description when taken in conjunction with the accompanying drawings, in which:

DETAILED DESCRIPTION OF THE PREFERRED EMBODIMENT

Figure 1:
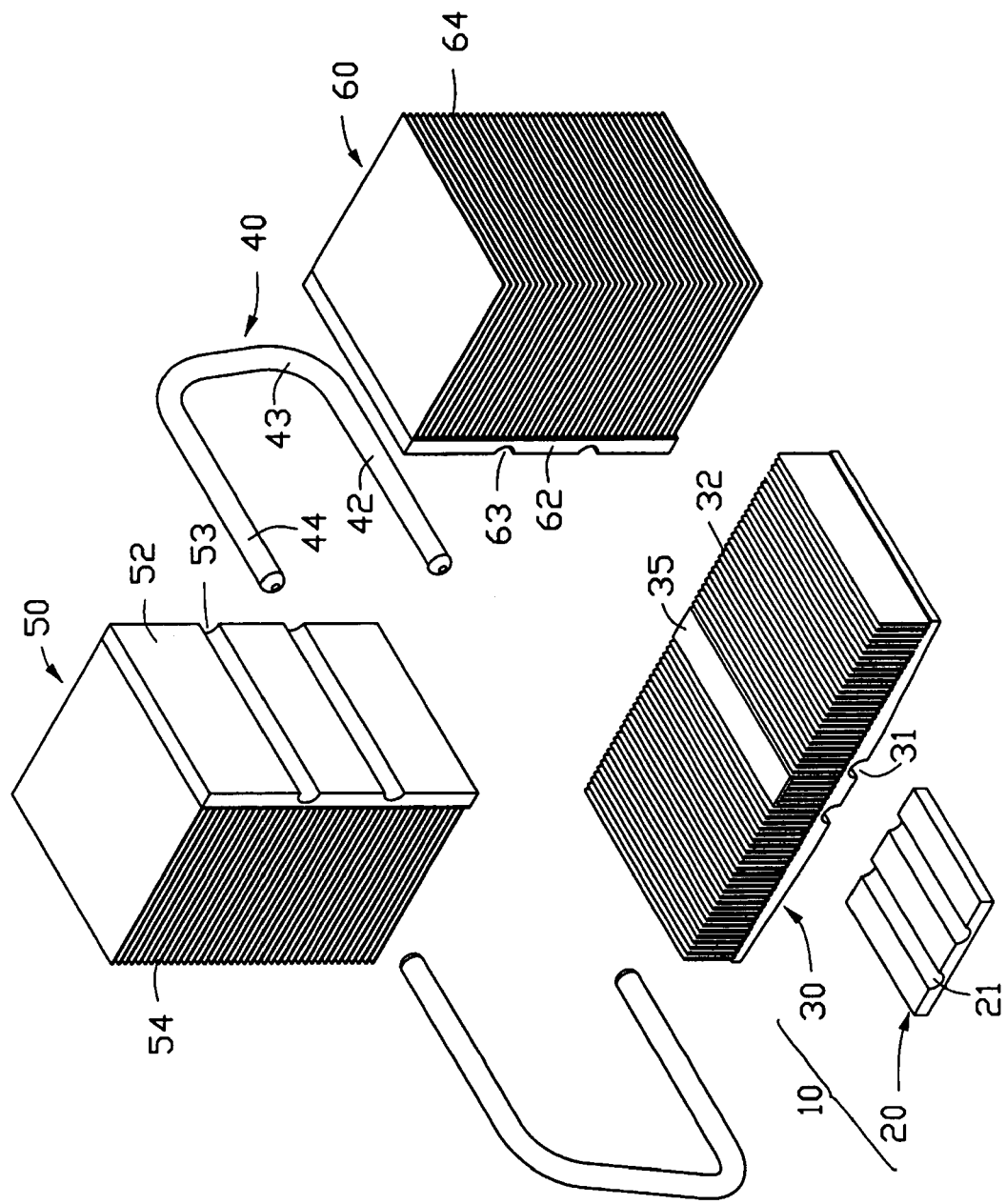
FIG. 1 is an exploded, isometric view of a heat dissipation device in accordance with a preferred embodiment of the present invention.

Reference will now be made to the drawing figures to describe a heat dissipation device in accordance with a preferred embodiment of the present invention.

Figure 2:
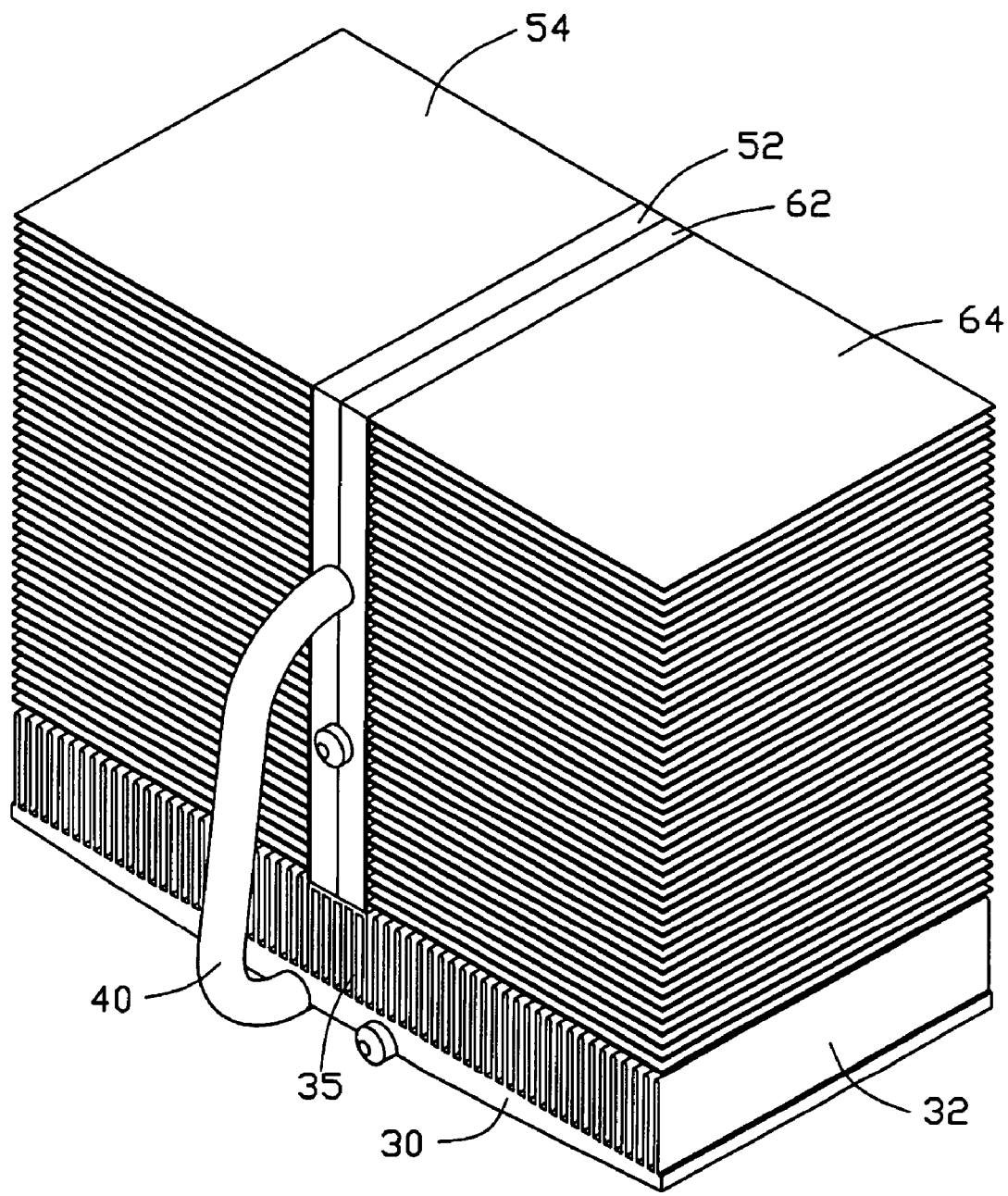
FIG. 2 is an assembled view of the heat dissipation device of FIG. 1.
Figure 3:
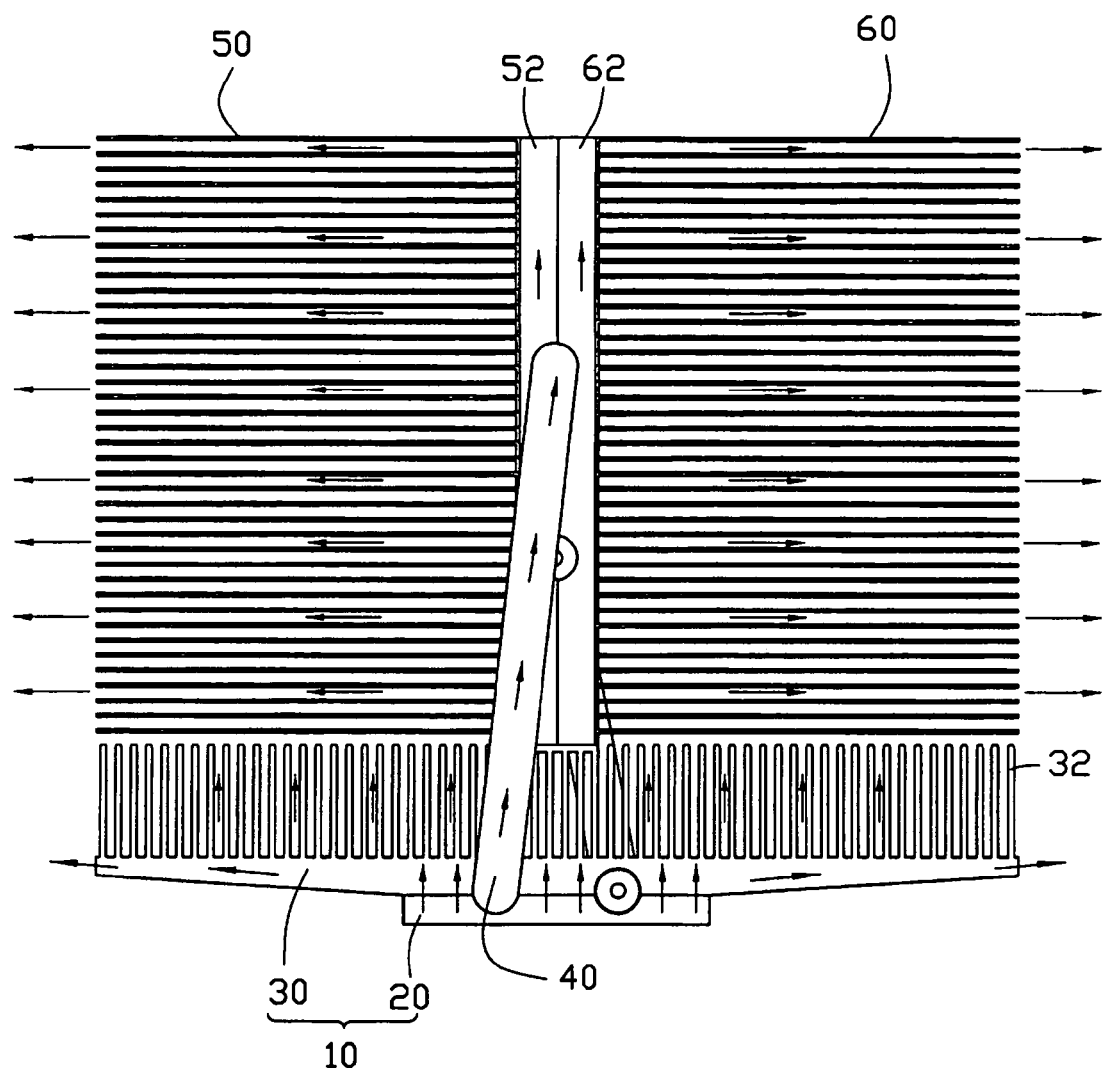
FIG. 3 is an elevation view of the heat dissipation device, showing heat-transferring paths in the heat dissipation device when the heat dissipation device is applied to a heat-generating electronic device.

Referring FIG. 1 to FIG. 3, the heat dissipation device is used to dissipate heat from a heat-generating electronic device (not shown) and comprises a heat spreader 10, two heat pipes 40 engaged with the heat spreader 10, a first heat sink 50 and a second heat sink 60. The first and second heat sinks 50, 60 jointly sandwich portions of the heat pipes 40 therebetween.

The heat spreader 10 comprises a heat-absorbing plate 20 and a heat-conducting plate 30 having a larger size than the heat-absorbing plate 20 and covering the heat-absorbing plate 20. The heat-absorbing plate 20 has a bottom face for contacting the electronic device and a top face (clearly shown in FIG. 1 but not labeled) opposite to the bottom face. A pair of parallel grooves 21 is defined at the top face of the heat-absorbing plate 20. The heat-conducting plate 30 has a bottom face (not labeled) in intimate contact with the top face of the heat-absorbing plate 20 and a pair of grooves 31 is defined at the bottom face of the heat-conducting plate 30. The grooves 31 are located corresponding to the grooves 21 of the heat-absorbing plate 20. The corresponding grooves 21, 31 join together to form a pair of channels when the top face of the heat-absorbing plate 20 is soldered to the bottom face of the heat-conducting plate 30. The heat-conducting plate 30 further comprises a top face (not labeled) opposite to the bottom face thereof and a plurality of parallel fins 32 extend perpendicularly upwardly from the top face of the heat-conducting plate 30. A supporting member 35 protrudes integrally and upwardly from a middle of the top face of the heat-conducting plate 30.

The heat pipes 40 each are in a shape of U and comprise a horizontal evaporating portion 42 fitted in said channels of the heat spreader 10 by soldering. A middle portion 43 perpendicularly extends from one end of the evaporating portion 42, away from the heat spreader 10. A condensing portion 44 further extends perpendicularly from the middle portion 43, parallel to the evaporating portion 42 and above the heat spreader 10.

The first heat sink 50 comprises a first solid base 52 perpendicular to the heat spreader 10, especially perpendicular to the heat-conducting plate 30, and a plurality of parallel first fins 54 extending laterally from a side face of the first base 52. The first fins 54 are parallel to the heat spreader 10 and perpendicular to the fins 32 formed on the heat-conducting plate 30. A pair of spaced first grooves 53 is defined in the other side face of the first base 52, extending parallel to the heat spreader 10, especially parallel to the channels defined by the grooves 21, 31.

The second heat sink 60 is constructed in the same manner as the first heat sink 50, and comprises a second base 62 opposing to and parallel to the first base 52 of the first heat sink 50 and a plurality of parallel second fins 64 extending laterally from a side face of the second base 62. A pair of second grooves 63 is defined in the second base 62 corresponding to the first grooves 53. The first fins 54 and the second fins 64 are parallel to and opposite to each other, and perpendicular to the fins 32 on the heat-conducting plate 30. The first heat sink 50 and the second heat sink 60 intimately contact each other, by soldering the first base 52 and the second base 62 together, and the corresponding first grooves 53 and the second grooves 63 jointly form a pair of holes for receiving the condensing portions 44 of the heat pipes 40. To get a better heat-spreading effectiveness in the bases 52, 62, the grooves 53, 63 are respectively so positioned in the bases that they divide the corresponding surface of the base 52, 62 to three equal regions. The holes formed by the first and second grooves 53, 63 of the bases 52, 62 thus are respectively disposed at a higher and a lower position above the heat spreader 10. The heat pipes 40 extend into the holes, as well as the channels formed in the heat spreader 10, via opposite front and rear sides of the heat sink. To strengthen the whole structure of the heat dissipation device, the first base 52 and the second base 62 are supported on the supporting member 35 and soldered thereto.

When the heat dissipation device is applied to the heat-generating electronic device by having the bottom face of the heat-absorbing plate 20 contacting with the heat-generating electronic device, heat transferring paths of the heat dissipation device is schematically illustrated in FIG. 3 by a plurality of arrows. The heat spreader 10 of the heat dissipation device draws heat from the electronic device via the heat-absorbing plate 20. One part of the heat is conducted to the heat-conducting plate 30, and further to the fins 32 thereon for directly dissipating out to the surrounding environment. The other part of the heat is immediately transferred to the first base 52 and the second base 62 via the heat pipes 40, and subsequently transferred to the first fins 54 and the second fins 64 for being dissipated out to the surrounding environment.

It is clearly seen that the heat absorbed by the heat spreader 10 can be dissipated into the surrounding environment through multiple paths: the vertically extending fins 32 and the horizontally extending fins 54, 64 via the heat pipes 40. Accordingly, the heat of the electronic device can be quickly released since heat dissipation performance of the heat dissipation device in accordance with the present invention is enhanced remarkably.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A heat dissipation device comprising:
   a heat spreader provided with a plurality of fins, the fins being supported on and unitary with a base, the fins extending upwardly from the base and the upper ends of some of the fins located at a center of the base being joined together by a platform which supports two heat sinks above the platform; the two heat sinks including;
   a first heat sink which is separated from the heat spreader and comprises a first base substantially perpendicular to the heat spreader and resting on the platform of the heat spreader, and a plurality of first fins formed on the first base;
   a second heat sink which is separated from the heat spreader and comprises a second base resting on the platform of the heat spreader and connecting with the first base and a plurality of second fins formed on the second base; and
   at least a heat pipe connecting the heat spreader to the first base and the second base and sandwiched between the first base and the second base, the at least a heat pipe transferring heat from the heat spreader to both of the first base and the second base.

2. The heat dissipation device as described in claim 1, wherein the second base is perpendicular to the heat spreader and parallel to the first base.

3. The heat dissipation device of claim 2, wherein the first fins and the second fins are parallel to each other.

4. The heat dissipation device of claim 3, wherein the first and second fins perpendicularly extends from corresponding base, parallel to the heat spreader.

5. The heat dissipation device as described in claim 4, wherein the first and second fins are perpendicular to the fins on the heat spreader.

6. The heat dissipation device of claim 1, wherein the heat spreader comprises a plate having a central portion and two lateral portions extending from two opposite sides of the central portion, the central portion has a first flat bottom face, the lateral portions each have a second inclined bottom face extending upwardly from the first flat bottom face.

7. The heat dissipation device as described in claim 1, wherein the heat spreader comprises a heat absorbing plate and a heat-conducting plate covering the heat absorbing plate so as to partly sandwich the at least a heat pipe therebetween.

8. The heat dissipation device as described in claim 1, wherein the at least a heat pipe is made to have a U-shaped configuration and comprises an evaporating portion attached to the heat spreader, a middle portion extending from one end of the evaporating portion, and a condensing portion extending from a free end of the middle portion and sandwiched between the first and second base.

9. The heat dissipation device as described in claim 1, wherein the platform is a flat plate located at top ends of the some of the fins of the heat spreader, and is integrally formed with the fins and the heat spreader as a one-piece metal member.

10. The heat dissipation device as described in claim 1, further comprising a heat pipe being shaped to have the same configuration as the at least a heat pipe, middle portions of the heat pipe and the at least a heat pipe being exposed at opposite sides of the heat dissipation device, respectively.

11. A heat dissipation device comprising:
a heat-absorbing plate;
a heat-conducting plate having a central portion intimately contacting the heat-absorbing plate and two lateral portions slanting away from the central portion and extending beyond the heat-absorbing plate;
a pair of bases intimately contacting each other and perpendicularly rested onto the heat-conducting plate;
a first heat pipe comprising a first evaporating portion sandwiched between the heat-absorbing plate and the heat-conducting plate, a first condensing portion sandwiched between the bases; and
a second heat pipe comprising a second evaporating portion sandwiched between the heat-absorbing plate and the heat-conducting plate, a second condensing portion sandwiched between the bases.

12. The heat dissipation device of claim 11, wherein the heat-conducting plate has the central portion thereof parallel to the heat absorbing plate and comprises a plurality of fins upwardly extending from the central portion and the lateral portions.

13. The heat dissipation device of claim 12, wherein a plurality of fins extend outwardly from each of the bases, and are disposed above the fins of the heat-conducting plate.

14. The heat dissipation device of claim 11, wherein the heat-conducting plate comprises a supporting member over the central portion thereof, and the bases are rested onto the supporting member.

15. The heat dissipation device of claim 11, wherein the first and second heat pipes engage with the heat dissipation device from opposite sides of the heat dissipation device.

16. The heat dissipation device of claim 11, wherein the second condensing portion is parallel to the first condensing portion and parallel to the heat-conducting plate.

17. A heat dissipation device comprising:
a heat spreader having a bottom face for contacting with a heat-generating electronic device, the heat spreader having a plurality of upwardly extending fins and a supporting member interconnecting to ends of some of the fins;
a heat sink positioned on the supporting member and the upwardly extending fins of the heat spreader and having a plurality of laterally extending fins; and
a pair of heat pipes each having an evaporating portion thermally connecting with the heat spreader and a condensing portion thermally connecting with the heat sink.

18. The heat dissipation device of claim 17, wherein the laterally extending fins of the heat sink comprises two groups of fins extending in opposite directions, respectively.

19. The heat dissipation device of claim 18, wherein the heat sink consisting of two parts and the condensing portions of the heat pipes are sandwich between the two parts, and the heat pipes extend through opposite sides of the heat dissipation device.

20. The heat dissipation device of claim 17, wherein the heat spreader comprises a plate having a central portion and two lateral portions extending from two opposite sides of the central portion, the central portion has a first flat bottom face, the lateral portions each have a second inclined bottom face extending upwardly from the first flat bottom face.

* * * * *